United States Patent [19]

Tanaka et al.

[11] Patent Number: 5,252,846
[45] Date of Patent: * Oct. 12, 1993

[54] SEMICONDUCTOR MEMORY DEVICE WITH AN IMPROVED ERRONEOUS WRITE CHARACTERISTIC AND ERASURE CHARACTERISTIC

[75] Inventors: Shinichi Tanaka, Tokyo; Masayuki Hori, Kawasaki; Kazunori Kanebako, Tokyo; Noriyoshi Tozawa, Yokohama, all of Japan

[73] Assignee: Kabushiki Kaisha Toshiba, Kawasaki, Japan

[ * ] Notice: The portion of the term of this patent subsequent to Feb. 26, 1991 has been disclaimed.

[21] Appl. No.: 908,871

[22] Filed: Jul. 7, 1992

Related U.S. Application Data

[63] Continuation of Ser. No. 611,432, Nov. 13, 1990, abandoned, which is a continuation of Ser. No. 166,422, Mar. 10, 1988, abandoned.

[30] Foreign Application Priority Data

Mar. 13, 1987 [JP] Japan .................................. 62-58109

[51] Int. Cl.⁵ .................. H01L 29/788; H01L 29/792
[52] U.S. Cl. .................... 257/317; 257/320; 257/324
[58] Field of Search .......... 357/23.5; 365/185; 257/317, 320, 324

[56] References Cited

U.S. PATENT DOCUMENTS

| | | | |
|---|---|---|---|
| 3,996,657 | 12/1976 | Simko et al. | 357/23.5 |
| 4,119,995 | 10/1978 | Simko | 357/23.5 |
| 4,437,172 | 3/1984 | Masuoka | 257/320 |
| 4,437,174 | 3/1984 | Masuoka | 257/320 |
| 4,466,081 | 8/1984 | Masuoka | 257/320 |
| 4,812,898 | 3/1989 | Sumihiro | 357/23.5 |
| 4,996,572 | 2/1991 | Tanaka et al. | 357/23.5 |

FOREIGN PATENT DOCUMENTS

| | | | |
|---|---|---|---|
| 0187278 | 7/1986 | European Pat. Off. | 257/324 |
| 0282022 | 9/1988 | European Pat. Off. | 257/324 |
| 60-250676 | 12/1985 | Japan | 357/23.5 |
| 61-204980 | 9/1986 | Japan | 357/23.5 |

OTHER PUBLICATIONS

IEEE Cat. No. 84 CH 2061-0, Sep. 10-12, 1984/San Diego, "Poly-oxide/nitride/oxide structures for highly reliable EPROM cells" by S. Mori et al.

Masuoka et al., A Flash E² PROM Cell Using Triple Polysilicon Technology, Proceedings of the IEEE International Electron Devices Meeting, Dec. 9-12, 1984.

*Primary Examiner*—Rolf Hille
*Assistant Examiner*—Steven Loke
*Attorney, Agent, or Firm*—Finnegan, Henderson, Farabow, Garrett & Dunner

[57] ABSTRACT

A semiconductor memory device containing a number of memory cells each having a floating gate, an erase gate, and a control gate. In a data erasure mode, electrons are discharged from the floating gate into the erase gate. In the semiconductor memory device, an impurity concentration in at least a region of the floating gate overlapping with the erase gate is lower than that of the erase gate.

8 Claims, 4 Drawing Sheets

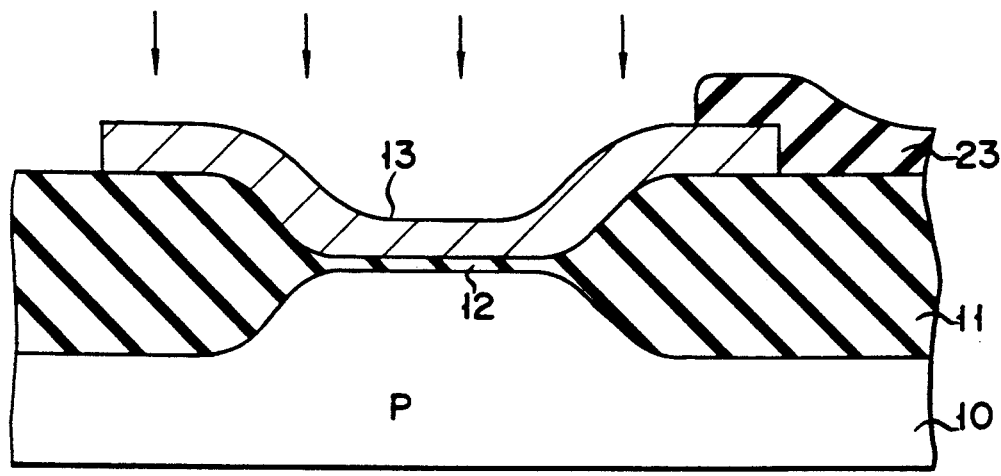
F I G. 7
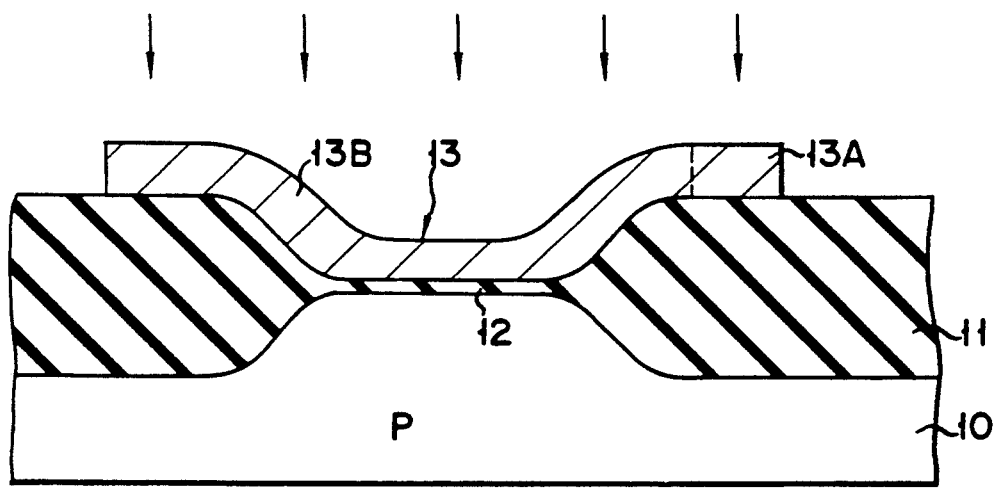
F I G. 8

SEMICONDUCTOR MEMORY DEVICE WITH AN IMPROVED ERRONEOUS WRITE CHARACTERISTIC AND ERASURE CHARACTERISTIC

This application is a continuation of application Ser. No. 07/611,432 filed Nov. 13, 1990, now abandoned, which is a continuation of application Ser. No. 07/166,422 filed Mar. 10, 1988, now abandoned.

BACKGROUND OF THE INVENTION

1. Field of the Invention

This invention relates to a semiconductor memory device into which data can be electrically written and from which data can be electrically erased. In particular, this invention relates to a semiconductor memory device wherein the data stored in all memory cells can be erased simultaneously.

2. Description of the Related Art

A flash type electrical erasable programmable read only memory (FE$^2$PROM) with a function to electrically erase all of the stored bits in a simultaneous manner is known as disclosed in U.S. Pat. Nos. 4,437,172 and 4,466,081. The FE$^2$PROM as disclosed in these patents allows the stored data to be electrically and simultaneously erased on all of the bit lines. With this advantageous feature, the FE$^2$PROM has progressively superseded the UV type EPROM in which the data stored therein is erased by ultraviolet rays.

An example of one of the memory cells constituting the FE$^2$PROM is illustrated in cross sectional form in FIG. 1.

In FIG. 1, showing the structure of the conventional memory cell, reference numeral 30 designates a p-type semiconductor substrate. Field oxide film 31 is layered on substrate 30, and erase gate 32, acting as a first polysilicon layer, is partially layered on field oxidation film 31. Reference numeral 33 indicates a gate oxide film. Floating gate 34 is layered on gate oxide film 33, and consists of a second polysilicon layer. The end portion of floating gate 34 is overlaid on the end portion of erase gate 32, with silicon oxide film 35 interlayered between them. Silicon oxide film 35 serves as an insulating film and is formed by oxidizing erase gate 32. Control gate 37, which serves as a third polysilicon layer, is layered over floating gate 34, with silicon oxide film 36 interlayered between them. Silicon oxide film 36 serves as an insulating film and is formed by oxidizing floating gate 34. Although not shown, source and drain regions as N type diffusion layers are provided on substrate 30, and located at sides of floating gate 34, respectively. An interlayer insulating film (not shown) is layered on control gate 37, and has contact holes opened to the source and drain regions, and the surfaces of erase gate 32 and control gate 37. Within each contact hole is formed a lead electrode made of aluminum.

The data write operation of the FE$^2$PROM with the memory cells thus structured is similar to that of a conventional EPROM. Specifically, a high voltage is applied to the drain region (not shown) of the memory cell, and control gate 37. The applied high voltage generates hot electrons in the channel region located under floating gate 34. The generated hot electrons are injected into the floating gate 34 as set at a predetermined potential, because the high voltage has been applied to control gate 37. The injection of electrons into floating gate 34 increases the threshold voltage in the channel region.

In an erasure mode, for erasing the data, a high voltage is applied to erase gate 32, to place the silicon oxide film 35 between erase gate 32 and floating gate 34 in a high electric field. Under this condition, the electrons which have been already injected into floating gate 34, are discharged into erase gate 32. As the result of this discharge, the threshold voltage in the channel region decreases, and the data is erased.

In a read mode for reading out the data, a fixed voltage is applied to the drain region and control gate 37. Under this condition, the memory cells into which the data have been written and whose channel regions have increased threshold voltage, are in an off state. Those memory cells whose data has been erased and whose channel regions have decreased threshold voltages, are in an on state. The on- and off-states are read out in the form of logical "1" and "0", respectively.

In the memory cell as mentioned above, for data erasure, electrons are discharged through silicon oxide film 35 to erase gate 32, from floating gate 34. Therefore, the erasure characteristic of this cell depends on the quality and thickness of silicon oxide film 35, and the shapes of floating gate 34 and erase gate 32, which are separated by silicon oxide film 35. To quicken the erasure operation, for example, silicon oxide film 35 is thin. Silicon oxide film 35 is reduced by appropriately selecting a way of process for erase gate 32 and a method of forming silicon oxide film 35. However, it is very difficult to appropriately select the process and formation. If the selection is inappropriate, the data write and erasure may be performed erroneously or more adversely silicon oxide film 35 may be electrically broken down. Thus, great care must be used for such selection.

In FE$^2$PROM, the cause for erroneous data write has been known and will be described. In the write mode, a high voltage is applied to control gate 37 and the drain. The same substrate further contains other memory cells which are not in the write mode, but whose control gates 37 are applied with the same high voltage. In those other memory cells, the potential at floating gate 34 is pulled to a high potential level, so that an electric field is developed between floating gate 34 and erase gate 32. It has been known that an irregularity, called asperity, is inevitably formed on the upper surface of a polysilicon layer. The leak current flowing from the first polysilicon layer having a surface of small asperity to the second polysilicon layer having a surface of great asperity is larger than the leak current flowing from the second polysilicon layer to the first polysilicon layer. In other words, more electrons move from the second to the first polysilicon layer than the first to the second polysilicon layer. In the case of the FIG. 1 memory cell, the asperity on the upper surface of erase gate 32 is larger than that on the lower surface of floating gate 34. Therefore, electrons may be injected into floating gate 34, through silicon oxide film 35 existing between erase gate 32 and floating gate 34. In this way, the erroneous data write is caused by injecting electrons into the floating gates of those memory cells which are not in the write mode.

An ideal characteristic required for the insulating films used in the memory cells in FE$^2$PROM is that the leak current easily flows in the erasure direction, but hardly flows in the opposite direction, i.e., the write direction. In this respect, the electrical characteristic of the conventional memory cell shown in FIG. 1 is not always satisfactory.

To cope with this, the memory cell as shown in sectional form in FIG. 2 has been proposed. In this memory cell, the first polysilicon layer constitutes floating gate 34. A second polysilicon layer forms an erase gate 32. Insulating film 38 existing between erase gate 32 and control gate 37 is formed by oxidizing the polysilicon of erase gate 32.

In the FIG. 2 prior art, one end portion of erase gate 32 is laid on the end portion of floating gate 34. Therefore, a relative large asperity is formed on the upper surface of floating gate 34. At this time, more electrons move from the lower surface of erase gate 32 having a surface of small asperity to the upper surface of floating gate 34 having a surface of great asperity than from the upper surface of floating gate 34 to the lower surface of erase gate 32. Therefore, in the memory cell of FIG. 2, the erroneous write operation is restricted and the erasure characteristic is improved.

In the FIG. 2 memory cell as well as the FIG. 1 memory cell, erase gate 32 and control gate 37 are used to conductive layer respectively. For the resistance reduction purpose, the polysilicon layers constituting the erase gate and the control gate are doped with impurity, for example, phosphorus atoms or arsenic atoms at $6 \times 10^{20}/cm^3$ or more of concentration, viz., at a concentration of the solution limit. Similarly, the polysilicon layer forming floating gate 34 is doped with phosphorus atoms or arsenic atoms at a concentration of the solution limit. Therefore, a degree of asperity occurring on the upper surface of floating gate 34 is small. A leak current caused between floating gate 34 and erase gate 32 in the erroneous write direction is nearly equal to that in the erasure direction. In this respect, the erroneous write characteristic and the erasure characteristic are both improved unsatisfactorily.

SUMMARY OF THE INVENTION

Accordingly, an object of this invention is to provide a semiconductor memory device with an improved erroneous write characteristic and erasure characteristic.

According to this invention, there is provided a semiconductor memory device having a semiconductor substrate of a first conductivity type, a floating gate containing an impurity at a predetermined concentration layered on a first insulating film which also is layered on the substrate, an erase gate above the floating gate, with a second insulating film interlaid therebetween, a part of said erase gate overlapping said floating gate, and said erase gate containing an impurity at a predetermined concentration, and a control gate layered above said floating gate with a third insulating film interlaid therebetween, wherein an impurity concentration in at least the part of floating gate overlapping the erase gate is lower than that of the erase gate.

BRIEF DESCRIPTION OF THE DRAWINGS

Other objects and advantages of this invention will become apparent from the following description when taken in connection with the drawings in which:

FIG. 7 is a sectional view showing a structure of a memory cell used for a semiconductor memory device according to this invention, the structure of the memory cell being in one of the steps to manufacture the memory cells; and FIG. 8 is a sectional view showing another structure of a memory cell used for a semiconductor memory device according to this invention, the structure of the memory cell being in one of the steps to manufacture the memory cells.

DETAILED DESCRIPTION OF THE PREFERRED EMBODIMENTS

Figure 1:
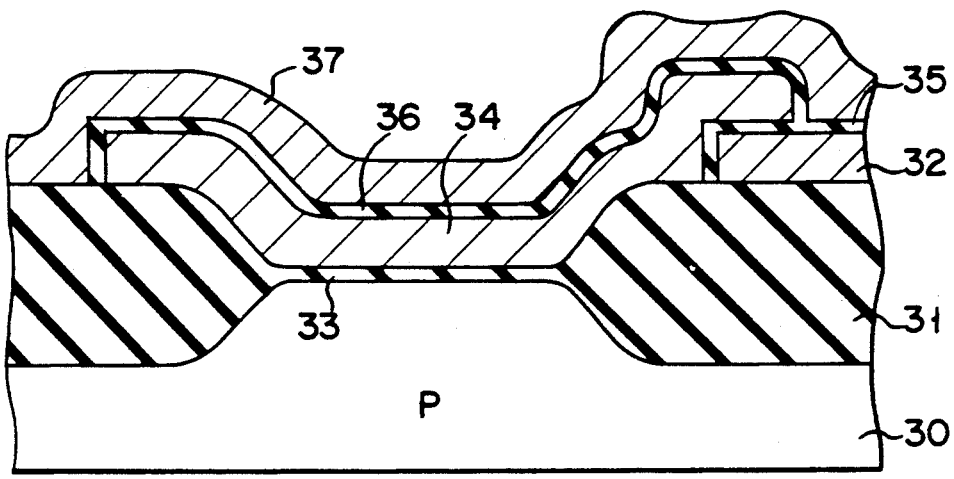
FIG. 1 is a sectional view of a memory cell used in a conventional device.
Figure 2:
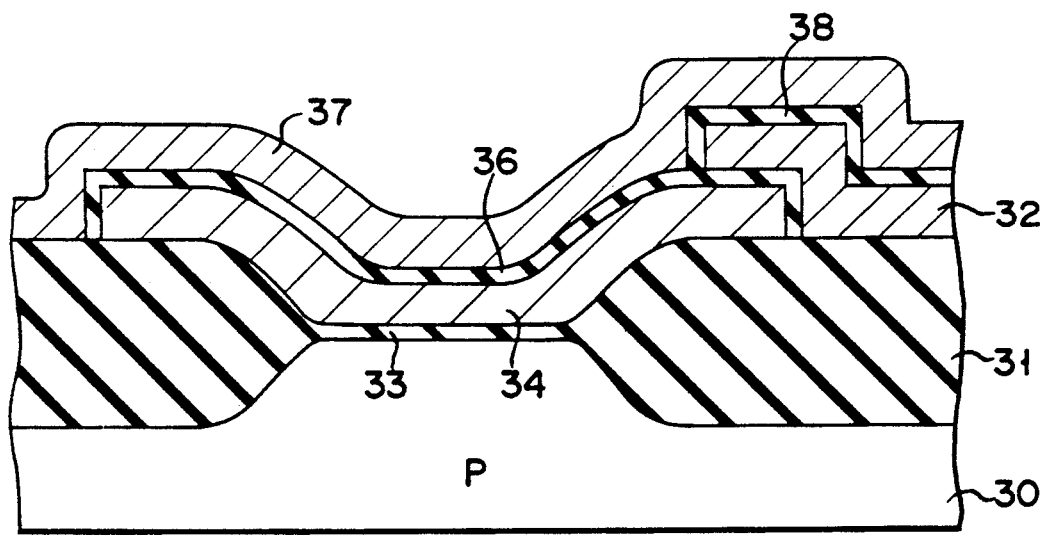
FIG. 2 is a sectional view of another memory cell used in a conventional memory device.
Figure 3:
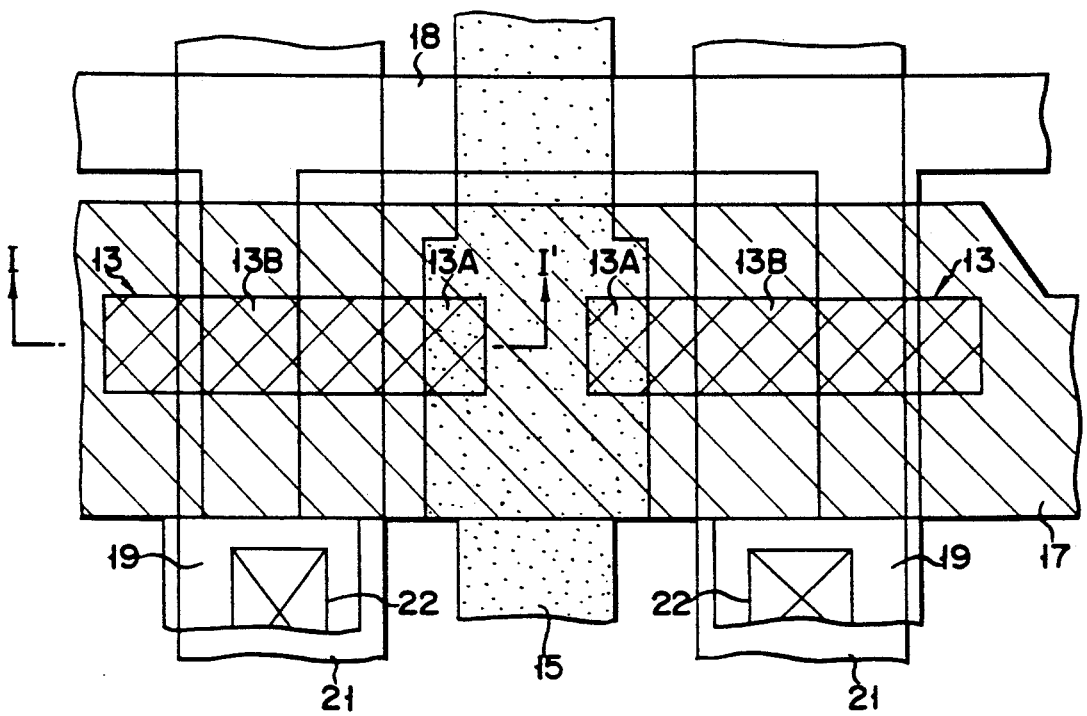
FIG. 3 is a plan view of a group of memory cells used in a semiconductor memory device according to this invention.
Figure 4:
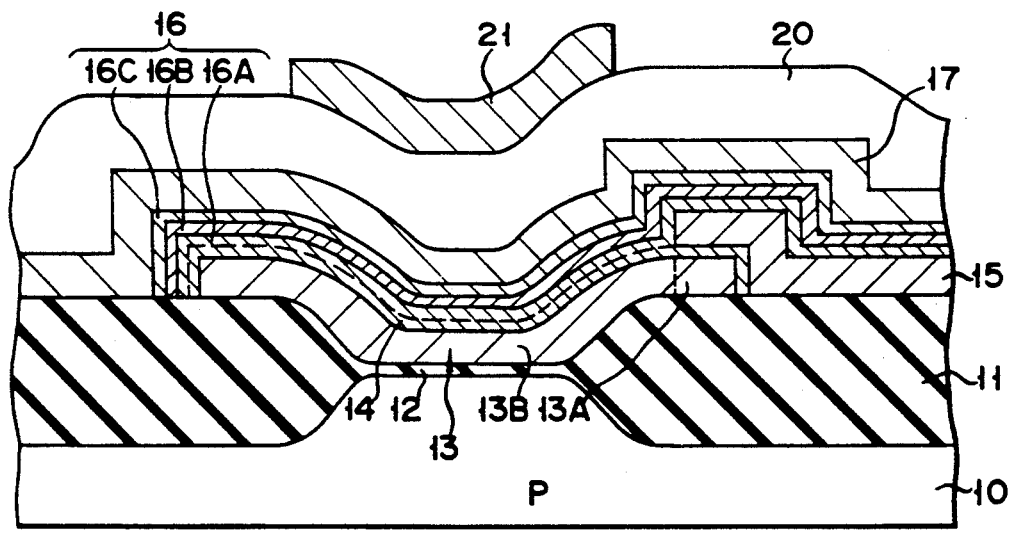
FIG. 4 is a sectional view taken on line I—I' in FIG. 3.

A preferred embodiment of a semiconductor memory device according to this invention will be described referring to FIGS. 3 and 4. A group of memory cells used for a semiconductor memory device according to this invention is shown in FIG. 3. A cross section of the memory cell taken on line I—I' is shown in FIG. 4. In the figure, reference numeral 10 designates a silicon semiconductor substrate of p-type. Field oxide film 11 for separating the adjacent memory cells from one another is formed on substrate 10. Gate oxide film 12 is formed on a specific location of substrate 10 which corresponds to a channel region in the element region as separated by field oxide film 11. Floating gate 13 as a first polysilicon layer is formed on gate oxide film 12. Both ends of floating gate 13 extend over field oxide film 11.

Erase gate 15 as a second polysilicon layer is laid above one end of floating gate 13 with silicon oxide film 14 interlaid therebetween. Silicon oxide film 14 serves as an insulating film and is formed by oxidizing the polysilicon layer of floating gate 13. Erase gate 15 overlaps with the end portions of floating gate 13 of two adjacent memory cells as viewed horizontally in FIG. 3. A three-layered film 16 is layered over floating gate 13 and erase gate 15. Control gate 17 consisting of a third polysilicon layer is continuously layered over the three layered film 16. Three-layered film 16 consists of first silicon oxide ($SiO_2$) film 16A as a bottom layer, second silicon nitride ($Si_3N_4$) film 16B as a medium layer, and a third silicon oxide ($SiO_2$) film 16C as a top layer. Source region 18 and drain region 19 as n-type diffusion layers are formed on the element region surfaces located at both sides of floating gate 13, respectively. Source region 18 is a single layer and used in common for all of the memory cells. Interlaying insulating film 20 is laid on control gate 17. Conductive layer 21 made of aluminum, for example, is formed on interlaying insulating film 20. Conductive layer 21 is connected to the drain region 19 of each memory cell, through contact hole 22. Erase gate 15 and control gate 17 are incorporated in each memory cell, and these are used as interconnection layers. For this reason, the polysilicon layers of the erase gate 15 and control gate 17 are doped with impurity, for example, phosphorus atoms or arsenic atoms at $6 \times 10^{\circ}/cm^3$ or more, i.e., a concentration equal or approximate to the solution limit. The same type of impurity is also doped into the first layer polysilicon layer of floating gate 13. The same type of impurity is doped into the region 13A of floating gate 13 laid under erase gate 15. In this case, the impurity concentration is much lower than that for erase gate 15 and control gate 17, and less than $6 \times 10^{20}/cm^3$ for example, in a range from $1 \times 10^{20}/cm^3$ to $4 \times 10^{20}/cm^3$. The region 13B of floating gate 13 not overlapping with erase gate 15 is doped with the same type of impurity at the same concentration as that of erase gate 15 and control gate erase 17, i.e., $6 \times 10^{20}/cm^3$.

Silicon oxide film 14 laid over floating gate 13 is formed by oxidizing the polysilicon layer of floating gate 13. The polysilicon layer satisfactorily doped with impurity at the concentration on the level of the solution limit is then oxidized, so that the asperity appearing on the surface is remarkably lessened. When the impurity concentration is less than $6 \times 10^{20}/cm^3$, the asperity rapidly increases on the surface of the polysilicon layer, after it is subjected to the subsequent oxidization process. It is estimated that the rapid increase of asperity is due to the fact that since the impurity concentration of the polysilicon layer is not uniform in the layer, the oxidization rate is not constant over the surface of the polysilicon layer.

For this reason, the asperity on the surface of the region 13A of floating gate 13 overlapping with erase gate 15 increase. Therefore, a concentration of an electric field occurs in the region 13A. In this region 13A, a accelerated electric field make it easy to generate the leak current between floating gate 13 and erase gate 15. The electric field is weaker than that in the flat area of region 13B. Thus, in the memory cell according to this invention, the leak current flows from floating gate 13 to erase gate 15 increases. In other words, when considering the electrons action, the electrons flow is enhanced in the direction from floating gate 13 toward erase gate 15, resulting in improvement of the erasure characteristic of the memory device.

The leak current flowing from floating gate 13 toward erase gate is not increased, while electrons flow in this direction is impeded. Therefore, the erroneous write operation is hard to occur.

Figure 5:
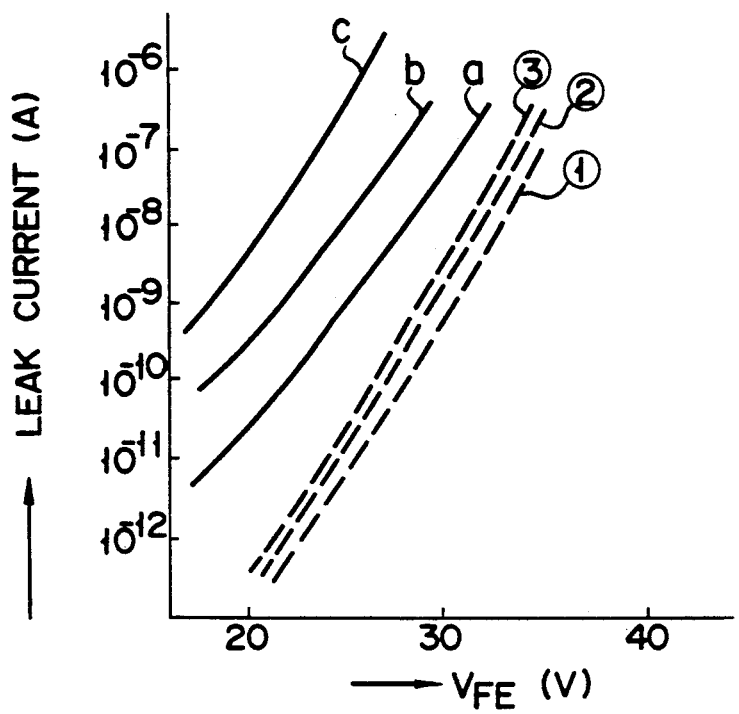
FIG. 5 is a graph showing a variation of the leak current vs. applied voltage of the semiconductor memory device according to this invention.

A graph of FIG. 5 comparatively shows leak current characteristics between the floating gate and the erase gate of the conventional memory cell and the memory cell of this embodiment. In the graph, the abscissa represents a voltage $V_{FE}(V)$ between the floating gate and the erase gate, and the ordinate a leak current (A).

Curves "a", "b" and "c" indicate variations of the leak current when a voltage $V_{FE}$ is applied to those gates, with its positive polarity at the erase gate. These curves "a", "b" and "c" are for the impurity (phosphorus) concentrations of the region 13A, $6 \times 10^{20}/cm^3$, $4 \times 10^{20}/cm^3$, and $2 \times 10^{20}/cm^3$, respectively. Further, curve "a" is the leak current variation of the conventional memory cell. Curves "b" and "c" show the leak current variation of the memory cells according to this embodiment. Curves ①, ② and ③ indicate variations of the leak current when a voltage $V_{FE}$ is applied to those gates, with its positive polarity at the floating gate. These curves ①, ② and ③ are for the impurity (phosphorus) concentrations of the region 13A, $6 \times 10^{20}/cm^3$, $4 \times 10^{20}/cm^3$, and $2 \times 10^{20}/cm^3$, respectively. Further, curve ① is the leak current variation of the conventional memory cell. Curves ② and ③ show the leak current variation of the memory cells according to this embodiment.

As seen from the graph, as the impurity concentration of region 13A, the leak current flowing from the erase gate to the floating gate becomes large. The leak current in this direction contributes to the discharge of electrons from the floating gate to the erase gate. As a result, the erasure characteristic can be improved by reducing the impurity concentration in the region 13A. The leak current flowing from the floating gate to the erase gate increases a little, while electrons move in this direction is impeded. This directional leak current contributes to the erroneous write operation in which electrons are injected into the floating gate. Thus, the increase of the leak current is small, and hence the occurrence of the erroneous write operation is limited. It is confirmed that in actual FE$^2$PROM memory cells, as the impurity concentration of the floating gate decreases, a rate of erroneous write occurrences (operations) decreases. This is because since the erasure characteristic of each cell is improved due to the low impurity concentration of the floating gate, many holes are in the floating gate, neutralize if less electrons than the holes are injected in to floating gate, the gate remains positively charged.

Figure 6:
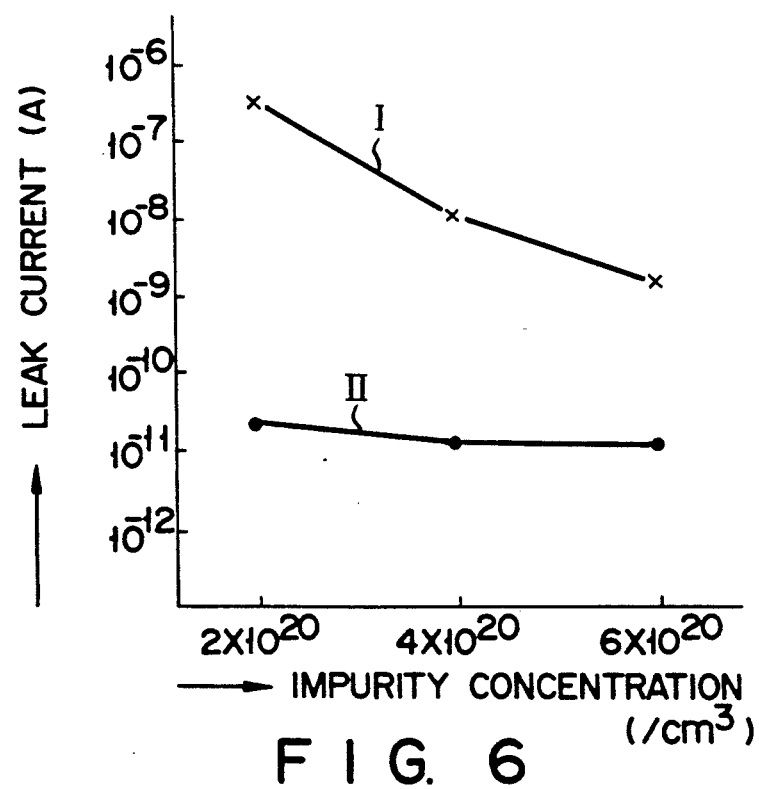
FIG. 6 is a graph showing a variation of the leak current vs. impurity concentration of the semiconductor memory device according to this invention.

FIG. 6 shows characteristic curves, which describe variations of the leak current between the floating gate and the erase gate. The abscissa of the graph represents a concentration ($/cm^3$) of impurity (phosphorus) in the region 13A of floating gate 13. The ordinate represents a leak current (A). In the graph, characteristic curve I indicates a variation of a leak current flowing from erase gate 15 to floating gate 13, when a voltage of 25 V is applied to between erase gate 15 and floating gate 13. In this case, erase gate 15 is set at the positive polarity of the applied voltage. This curve shows that the leak current increases with reduction of the impurity concentration of the region 13A of floating gate 13. The increased leak current provides an improved erasure characteristic.

Characteristic curve II indicates a variation of a leak current flowing from floating gate 13 to erase gate 15, when a voltage of 25 V is applied to between floating gate 13 and erase gate 15. In this case, floating gate 13 is set at the positive polarity of the applied voltage. This curve II shows that the leak current increases a little when the impurity concentration in the region 13A is decreased.

These curves also show that in the vicinity of $6 \times 10^{20}/cm^3$ of impurity concentration, a difference between the leak currents flowing from floating gate 13 to erase gate 15 and from erase gate 15 to floating gate 13 is small. It is known that when the current difference is below a value of 2 digits or less, the erasure characteristic and production yield are deteriorated. Therefore, if the impurity concentration is set in the range from $4 \times 10^{20}/cm^3$ to $2 \times 10^{20}/cm^3$, the current difference is satisfactorily large, and the memory device is free from the problem of the erasure characteristic and production yield.

Description to follow is for a method of manufacturing the memory cells functioning as described above. To begin with, filed oxide film 11 is formed on substrate 10. the first polysilicon layer is deposited thereon. Appropriate impurity such as phosphorus or arsenic are diffused into the polysilicon layer. The first polysilicon layer is patterned by reactive ion etching process (RIE), to form floating gate 13. The structure is thermally oxidized in a condition that it is placed at 1000° C. and for 30 minutes in gas containing $O_2$ and $N_2$ or $O_2$ and Ar with the proportion of 2 to 8. As the result of this thermal oxidation, silicon oxide film 14, 350 Angstroms thick, is formed on the surface of floating gate 13. A second polysilicon layer is deposited over the surface of the structure. Phosphorus or arsenic impurity at $6 \times 10^{20}/cm^3$ is diffused into the second polysilicon layer. Then, the second polysilicon layer is patterned by chemical dry etching (CDE) process, to form erase gate 15. The structure is thermally oxidized in a condition that it is placed at 1000° C. and for 30 minutes in gas containing $O_2$ and $N_2$ or $O_2$ and Ar with the proportion of 5 to 5. As the result of this thermal oxidation, silicon oxide film 16A, 400 Angstroms thick, is formed over floating gate 13 and erase gate 15. Silicon nitride film 16B of 150 Angstroms in thickness is then formed over silicon oxide film 16A by chemical vapor deposition (CVD) process at 700° C. and for 20 minutes. The structure is placed in a wet atmosphere and thermally oxidized at 1000° C. and for 50 minutes, to form silicon oxide film 16C of 50 Angstroms in thickness on the surface of silicon nitride film 16B. A third polysilicon layer is deposited and doped with phosphorus or arsenic impurity at $6 \times 10^{20}/cm^3$ or more, and then is patterned, to form control gate 17.

The process steps to reduce the impurity concentration in the region 13A of floating gate 13 follows. Reference is made to FIG. 7 for this description. Following the steps to form field oxide film 11 and gate oxide film 12, the first polysilicon layer is deposited over the entire surface of the structure. Then, the first polysilicon layer is patterned to form floating gate 13. Subsequently, the portion to be used as region 13A is selectively covered with ion implanting mask 23 made of photo register, for example. Phosphorus or arsenic ions are implanted into floating gate 13 at a predetermined acceleration voltage and a predetermined dosage, by ion implantation process.

After removal of mask 23, phosphorus or arsenic ions are implanted into floating gate 13, again (see FIG. 8). Before this second ion implantation, the acceleration voltage and dosage must be selected so that the impurity concentration of region 13A is in a range from $1 \times 10^{20}/cm^3$ to $4 \times 10^{20}/cm^3$, and that in region 13B is $6 \times 10^{20}/cm^3$ or more. In this way, the concentration in the region 13A of floating gate 13 is set within the range from $1 \times 10^{20}/cm^3$ to $4 \times 10^{20}/cm^3$, and that in region 13B is $6 \times 10^{20}/cm^3$ or more.

A second embodiment of a semiconductor memory device according to this invention will be described. In the second embodiment, the impurity concentration in the region 13A of floating gate 13 of each memory cell is set to be equal to that in region 13B. The exact value of the concentration is $1 \times 10^{20}/cm^3$ to $4 \times 10^{20}/cm^3$, which is lower than $6 \times 10^{20}/cm^3$ of erase gate 15. This embodiment also attains the impurity concentration relationships of the region 13B of floating gate 13 and erase gate 15, which is comparable with that of the first embodiment. Therefore, the satisfactory improvement of the erasure characteristic and production yield can be expected.

In this embodiment, there is a danger that the leak current flowing from control gate 18 toward floating gate 13 increases, to deteriorate the electron holding characteristic of floating gate 13. It is noted, however, that the three-layered film 16 consisting of silicon oxide film 16A, silicon nitride film 16B and silicon oxide film 16C is used for the insulating film interlaid between them. This insulating film prevents the electrons from being discharged from floating gate 13. The reason for this will be descried below.

A first reason for this is that the three-layered film has a lower density of the weak spots contained in the insulating film than the single insulating film. A second reason resides in the current mechanism peculiar to the three-layered film. A number of carriers generated when the leak current is caused are electrons in silicon oxide film 16A or 16C of the three-layered film, and these are holes in silicon nitride film 16B. The leak current is caused in silicon nitride film 16B either when hole current is easy to flow due to the weak spots or when electron current is easy to flow in silicon nitride film. Since there is a rare case that both currents flow simultaneously, the leak current flowing from control gate 17 toward floating gate 13 will never be increased.

As described, it will be understood that this invention successfully improves the erroneous write characteristic and the erasure characteristics.

What is claimed is:

1. A semiconductor memory device comprising:
    a semiconductor substrate of a first conductivity type;
    a floating gate containing an impurity at a predetermined concentration and layered on a first insulating film which is also layered on said substrate;
    an erase gate layered above said flowing gate, with a second insulating film interlaid therebetween, a part of said erase gate overlapping with said floating gate, and said erase gate containing impurity at a predetermined concentration; and
    a control gate layered above said floating gate and said erase gate, including said part of said erase gate overlapping with said floating gate, with a third insulating film interlaid therebetween;
    wherein an impurity concentration in at least a part of said floating gate overlapping with the erase gate is lower than that of said erase gate.

2. A semiconductor memory device according to claim 1, wherein the impurity concentration in said erase gate is $6 \times 10^{20}/cm^3$ or more, and the impurity concentration in said part of said floating gate is less than $6 \times 10^{20}/cm^3$.

3. A semiconductor memory device according to claim 1, wherein the impurity concentration in said erase gate is $6 \times 10^{20}/cm^3$ or more, and the impurity concentration in the whole of said floating gate is less than $6 \times 10^{20}/cm^3$.

4. A semiconductor memory device according to claim 1, wherein said floating gate, said erase gate, and said control gate are made of polysilicon, and the impurity contained in said floating gate and said erase gate, and an impurity in said control gate is phosphorus.

5. A semiconductor memory device according to claim 1, wherein said floating gate, said erase gate, and said control gate are made of polysilicon, and the impurity contained in said floating gate and said erase gate, and an impurity in said control gate is arsenic.

6. A semiconductor memory device according to claim 1, wherein an insulating film having a three-layered structure consisting of a first oxide film, a nitride film, and a second oxide film is interlaid between said erase gate and said control gate.

7. A semiconductor memory device according to claim 1, wherein said control gate is laid over said erase gate, with said third insulating film interlaid therebetween.

8. A semiconductor memory device according to claim 1, wherein said third insulating film has a three-layered structure consisting of a first oxide film, a nitride film and a second oxide film.

* * * * *

UNITED STATES PATENT AND TRADEMARK OFFICE
CERTIFICATE OF CORRECTION

PATENT NO. : 5,252,846
DATED : October 12, 1993
INVENTOR(S) : Shinichi Tanaka et al.

It is certified that error appears in the above-indentified patent and that said Letters Patent is hereby corrected as shown below:

On the title page, under Notice, change "1991" to --2008--.

Signed and Sealed this

Twenty-third Day of August, 1994

Attest:

BRUCE LEHMAN

Attesting Officer  Commissioner of Patents and Trademarks